US006503331B1

United States Patent
Yudovsky et al.

(10) Patent No.: US 6,503,331 B1
(45) Date of Patent: Jan. 7, 2003

(54) TUNGSTEN CHAMBER WITH STATIONARY HEATER

(75) Inventors: Joseph Yudovsky, Campbell, CA (US); Lawrence C. Lei, Sunnyvale, CA (US); Salvador Umotoy, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/660,006

(22) Filed: Sep. 12, 2000

(51) Int. Cl.$^7$ ............................................. C23C 16/00
(52) U.S. Cl. ........................ 118/720; 118/725; 118/729
(58) Field of Search ................................. 118/720, 725, 118/729

(56) References Cited

U.S. PATENT DOCUMENTS

| | | | | |
|---|---|---|---|---|
| 5,447,570 A | * | 9/1995 | Schmitz ....................... 118/728 |
| 5,462,603 A | * | 10/1995 | Murakami ................... 118/729 |
| 5,525,160 A | * | 6/1996 | Tanaka ......................... 118/729 |
| 5,660,673 A | | 8/1997 | Miyoshi ....................... 156/345 |
| 5,676,758 A | | 10/1997 | Hasegawa ................... 118/173 |
| 5,772,773 A | * | 6/1998 | Wytman ...................... 118/729 |
| 5,928,427 A | * | 7/1999 | Hwang ........................ 118/729 |
| 5,997,651 A | * | 12/1999 | Matsuse ...................... 118/729 |
| 6,051,286 A | | 4/2000 | Zhao ........................... 427/576 |

* cited by examiner

Primary Examiner—Richard Bueker
(74) Attorney, Agent, or Firm—Adler & Associates

(57) ABSTRACT

Provided herewith is a chamber for depositing a film on a substrate comprising a process compartment; a purge compartment, a purge ring located on the chamber body to separate the two compartments, a heater, and a shadow ring covering the periphery of the substrate. Alternatively, the chamber may further comprise a shield interconnected with the shadow ring. Still provided is a method for depositing a film of uniformity on a substrate in such a chamber. The method comprises the steps of positioning the substrate in a process compartment; flowing a process gas into the process compartment; flowing a purge gas in a purge compartment; and exhausting the process and purge gas from the chamber, thereby depositing a film of uniformity on the substrate.

23 Claims, 5 Drawing Sheets

TUNGSTEN CHAMBER WITH STATIONARY HEATER

BACKGROUND OF THE INVENTION

1. Field of the Invention

The present invention relates generally to the field of semiconductor manufacturing. More specifically, the present invention relates to a tungsten chamber with a stationary heater useful, for example, in chemical vapor deposition processes.

2. Description of the Related Art

Chemical vapor deposition (CVD) is one of a number of processes used to deposit thin films of material on semiconductor substrates. To process substrates using CVD, a vacuum chamber is provided with a susceptor configured to receive a substrate. In a typical CVD chamber, the substrate is placed into and removed from the chamber by a robot blade and is supported by the susceptor during processing. A precursor gas is charged to the vacuum chamber through a gas manifold plate situated above the substrate, where the substrate is heated to process temperatures, generally in the range of about 250°–650° C. The precursor gas reacts on the heated substrate surface to deposit a thin layer thereon and to form volatile by-product gases, which are pumped away through the chamber exhaust system.

One cause of particulate contamination in the chamber is deposition of material at the edge or on the backside of the substrate. Substrate edges are typically beveled, making deposition difficult to control over these surfaces and deposition at substrate edges can be, therefore, non-uniform. This may lead to deposited layers that do not adhere properly to the substrate edge and eventually chip or flake off, causing unwanted particle generation in the chamber. Additionally, chemical mechanical polishing is often used to smooth the surface of a substrate coated with tungsten or other metals. The act of polishing will cause any deposits on the edge and backside surfaces to flake off and generate unwanted particles.

Different approaches have been employed to control the deposition of process gases on the edge of a substrate during processing. One approach employs a shadow ring that essentially masks a portion of the perimeter of the substrate from the process gases. However, this method reduces the overall useful surface area of the substrate and in light of the current demand from chip manufacturers for zero edge exclusion, this method is becoming impractical.

Another approach to control the deposition of process gases on the edge of a substrate employs a gas manifold near the edge of the substrate for the delivery of purge gas past the edge to prevent edge deposition on the substrate. The purge gas inhibits the deposition of process gases at the substrate edge, but the purge gas also mixes with the process gas and is typically exhausted through the same manifold as the process gas. This mixing can lead to dilution of the process gas and/or non-uniform deposition of the gases on the substrate surface. A third approach uses a shadow ring and a purge gas channel in combination to form a purge gas chamber adjacent to the substrate edge having a purge gas inlet and outlet. This system requires a higher pressure within the purge gas chamber than in the process chamber to keep the process gas from being drawn into the purge gas outlet. Therefore, the purge gas is drawn into the chamber and out through the processing chamber exhaust system. Drawing the purge gas into the exhaust system of the process chamber can have a negative effect on the process uniformity over the substrate surface.

The prior art is deficient in the lack of an effective device and/or means that allows for full surface coverage of a substrate so as to prevent backside and edge deposition without disrupting the uniformity of the process gases and the resulting uniformity of the film formed on the substrate. Specifically, the prior art is deficient in the lack of effective devices/means to separate the processing compartment from the purge compartment in a vacuum chamber and therefore avoid the mixing of the process gas and purge gas, and prevent substrate backside and edge deposition. The present invention fulfills these long-standing needs and desires in the art.

SUMMARY OF THE INVENTION

In one aspect, there is provided a chamber for depositing a film on a substrate for semiconductor manufacturing, comprising a process compartment; a purge compartment; a purge ring located on the chamber body to separate the process compartment from the purge compartment; a heater; and a shadow ring. The shadow ring covers the periphery of the substrate.

In another aspect, there is provided a method for depositing a film of uniformity on a substrate in a chamber. This method comprises the following steps: (1) positioning the substrate on a substrate receiving surface of a substrate support member in a process compartment. The periphery of the substrate is covered by a shadow ring; (2) flowing a process gas into the process compartment and to the non-covered areas of the substrate; (3) flowing a purge gas through a purge gas channel positioned in a purge compartment. The purge compartment is separated from the process compartment by a purge ring; and (4) exhausting the process and purge gas from the chamber through a pumping channel formed in the chamber body. As a result, a uniform film is deposited on the substrate in the chamber.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIGS. 1A and 1B are in accordance with one embodiment of the invention.

FIGS. 2A and 2B are in accordance with another embodiment of the invention.

DETAILED DESCRIPTION OF THE INVENTION

Figure 1A:
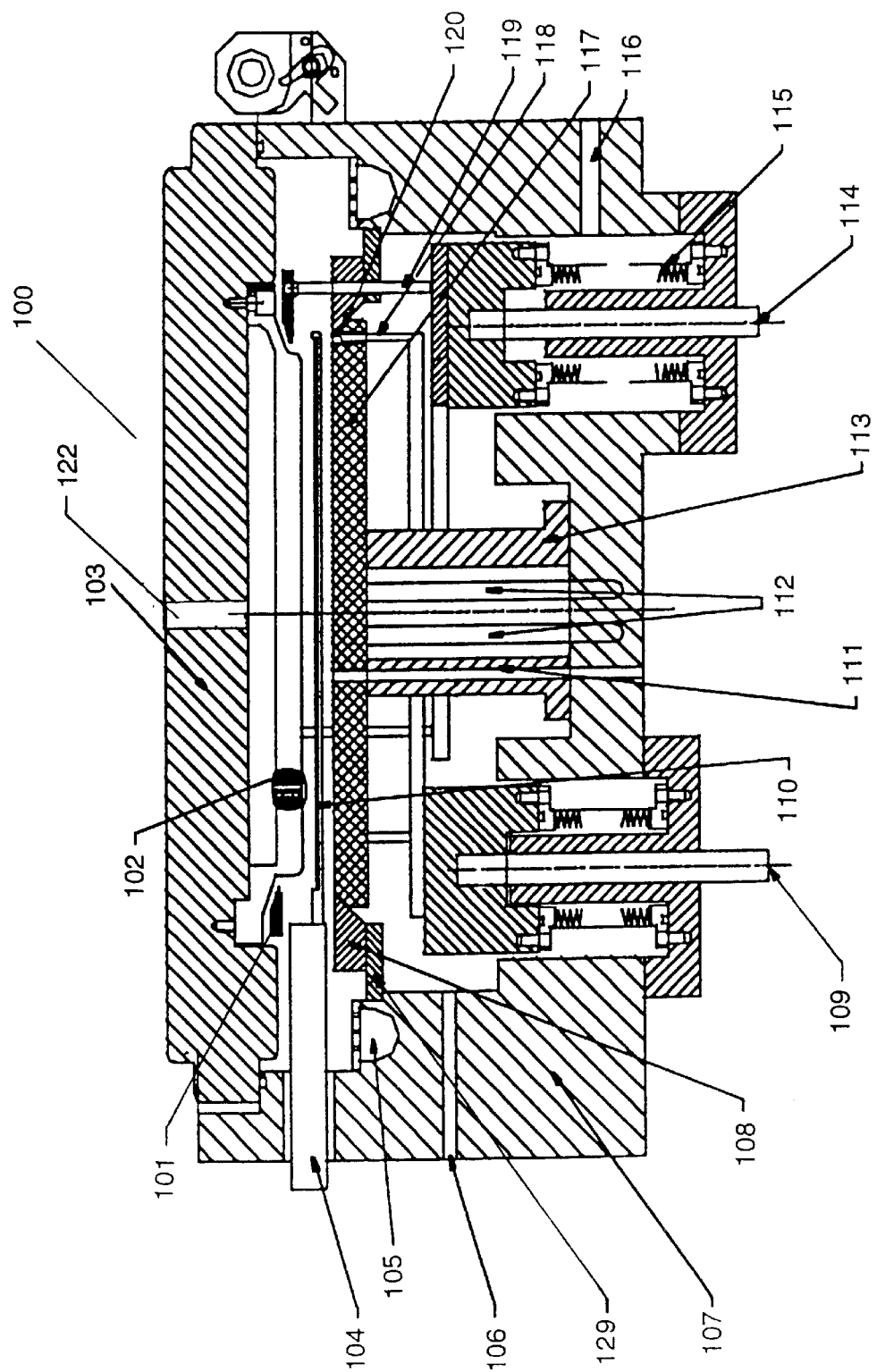
FIG. 1A is a cross sectional view of the tungsten chamber 100 during the process of loading a wafer.
Figure 1B:
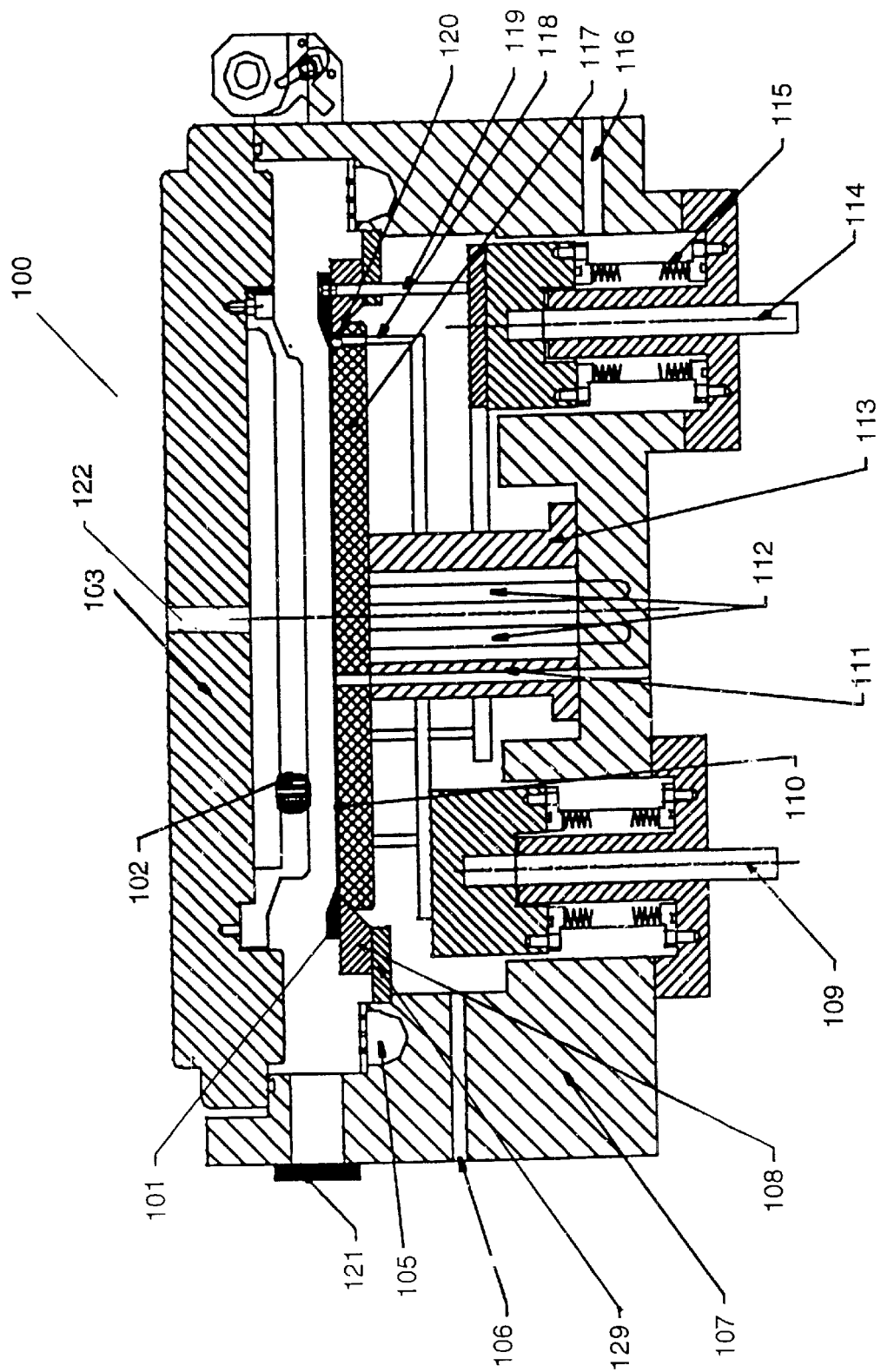
FIG. 1B is a cross sectional view of the tungsten chamber 100 during wafer processing. The tungsten chamber 100 comprises shadow ring 101, shower head 102, lid 103, pumping channel 105, purge channel 106, chamber body 107, purge ring 108, wafer lift actuator 109, vacuum channel 111, terminals 112, heater shaft 113, shadow ring lift actuator 114, bellows 115, purge gas channel 116, heater 117, wafer lift pin 118, shadow ring lift pin 119, edge purge 120, slit valve 121, annular support member 129, and inlet 122 for process gases.
Figure 2A:
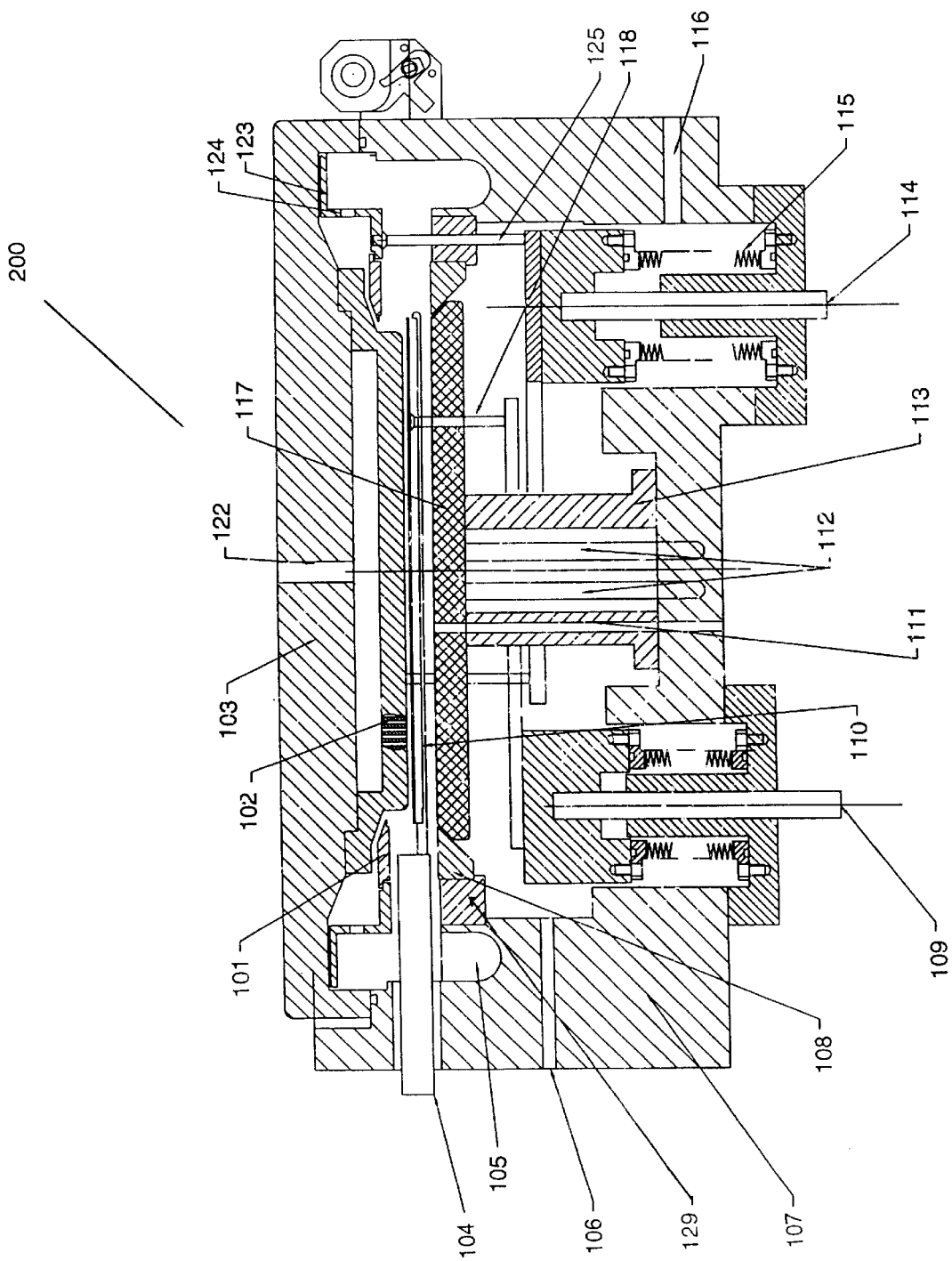
FIG. 2A and FIG. 2B are cross sectional view of the tungsten chamber 200 during the loading and processing of a wafer, respectively. The tungsten chamber 200 comprises all the parts except the shadow ring lift pin compared to the tungsten chamber 100. Additionally, chamber 200 comprises a movable shield 123, which has a plurality of pumping holes 124, and shield lift pin 125.
Figure 2B:
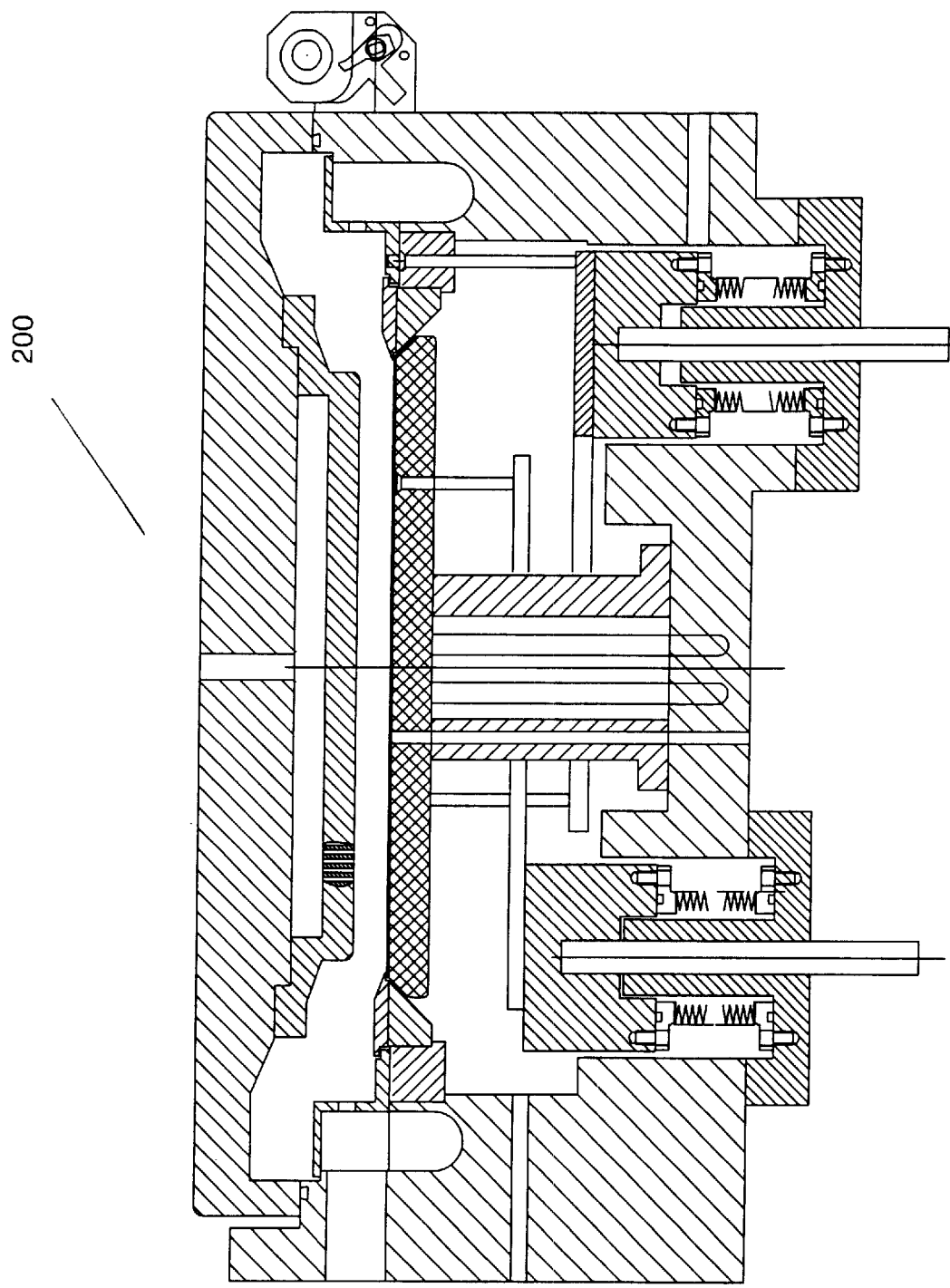

The various embodiments of the present invention may be illustrated, described and understood, inter alia, with reference to the attached Figures. Provided herein is a vacuum chamber with a stationary heater. FIGS. 1A and 1B show cross sectional views of chamber 100. The substrate (e.g., wafer 110) is brought into the chamber through the opening of slit valve 121 from an external robot blade 104 and placed on a support member, which is a heater 117. The heater is supported by heater shaft 113. Heaters made of ceramic, aluminum or aluminum nitride may be used. Optionally, the chamber may further comprise a movable shield 123, which blocks the opening of the slit valve 121 and creates symmetrical compartments around the heater 117 during process. FIGS. 2A and 2B show cross sectional views of chamber 200 with the structure of shield 123.

This vacuum chamber may be used to deposit metals, such as tungsten, from $WF_6$ precursor gas onto the substrate as well as other metals and dielectrics. $WF_6$ is a highly volatile gas, and problems persist in the prior art because tungsten deposits not only on the top side of the substrate, but also on the edge surfaces and back side of the substrate. These edge and back side surfaces are typically rougher than the highly polished top surface and are not coated with an adhesive layer such as sputtered titanium nitride and, thus, the deposited materials tend to flake off the edge and bottom surfaces of the substrate, thereby contaminating the chamber. Also, material deposited on these surfaces may compromise the integrity of the devices formed near the edge of the substrate.

Thus, shadow rings were used herein as described below. Shadow rings cover the periphery of the substrate during deposition to mask this area of the substrate, thereby preventing the deposition gases from reaching the edge and back side surfaces of the substrate. Further provided herein is shadow ring 101 housed within the vacuum chamber, which operates to provide an exclusionary zone where no deposition occurs at the edge of wafer 110. Motion actuator 109 interconnected to the wafer lift 118 or motion actuator 114 interconnected to the shadow ring lift 119 is adapted to move the wafer or shadow ring vertically within the process chamber alternately among 3 or 4 stops.

Figure 3:
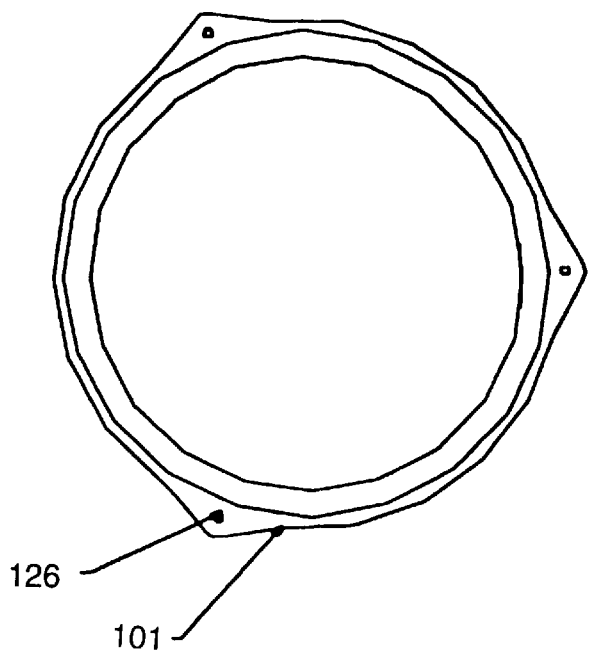
FIG. 3 shows the configuration of the shadow ring 101, which has three holes 126 for lift pins.
Figure 4:
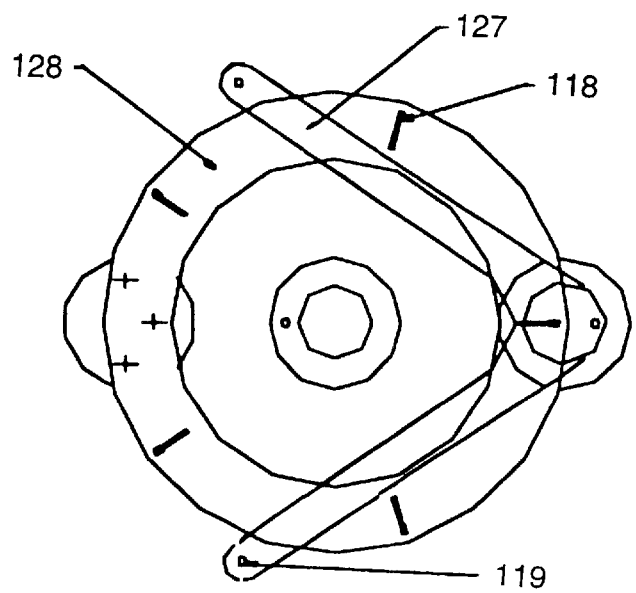
FIG. 4 shows the wafer and the shadow ring lift, which comprises the shadow ring lift plate 127, the wafer lift plate 128, wafer lift pins 118 and shadow ring lift pins 119.

FIG. 4 shows the structure of the wafer and shadow ring lift, which comprises shadow ring lift plate 127, wafer lift plate 128, wafer lift pins 118 (5 total) and shadow ring lift pins 119 (3 total). Correspondingly, the shadow ring 101 has three holes for lift pins (FIG. 3).

However, due to the volatility of $WF_6$, for example, shadow rings alone do not prevent edge and back side deposition on the substrate. The use of a purge gas directed behind or at the edge of the substrate behind the shadow ring was therefore applied. Further provided herewith is a purge gas system which includes purge ring 108 disposed adjacent to the substrate receiving surface and located on the chamber body, purge channel 106, purge gas channel 116, and edge purge 120. The purge gas is passed over the perimeter of the substrate receiving surface, exerting a positive pressure that reduces the likelihood that process gas will reach these edge and back side surfaces of the substrate.

During purging, the purge gas and the process gas are removed by an exhausting system which comprises pumping channel 105 positioned in the purge compartment of the chamber, and optionally a plurality of pumping holes 124 in shield 123. This approach provides a controllable flow of purge gas past the edge of a substrate without negatively effecting process gas uniformity over the surface of the substrate. Typically, purge gas is delivered to the substrate from below the edge so that it flows around the edge of the substrate and effectively flows over the upper surface of the substrate in a direction perpendicular to the edge of the substrate.

Generally, purge gases are inert gases such as argon. However, a small amount of a reactive gas such as hydrogen can be added to the purge gas to enhance deposition of tungsten or other process gases at the edge of the substrate. Reactive gases, such as hydrogen, react with, $WF_6$, to increase the dissociation of $WF_6$ and increase the amount of deposit on the surface of the substrate near the edge thus overcoming the non-uniformity of deposition on the substrate.

Therefore, to deposit a metal or dielectric film on a substrate in chamber 100 or 200, several steps are involved. Wafer 110 is first brought into the chamber when the support member, i.e., heater 117, is in a position below the opening of slit valve 121. Wafer 110 is supported initially by a set of wafer lift pins 118 that pass through the heater and are driven by wafer lift actuator 109. The actuator 109 is a step motor and the lift transmission is fulfilled via a slider-crank mechanism (i.e., crank shaft).

When wafer 110 and heater 117 affixed thereto reach the processing position, the process gas is turned on and deposition of tungsten or other film is begun. Purge gas is flown into the chamber through a purge gas channel positioned in a purge compartment, which is separated from the process compartment by a purge ring. Lastly, spent process and purge gases and by-product gases are exhausted from the chamber by means of the exhaust system comprising pumping channel 105.

The tungsten chamber disclosed herein contains a separate purge compartment from the process compartment. The separation is provided by a purge ring, which is located on the chamber body instead of sitting on the hot heater. Such design provides a controllable small slot between the hot heater and cold purge ring. Purge gas with hydrogen added can be directly delivered to the slot to provide equal distribution of the gas on the edge of the substrate for bottom purge. Since the purge ring is not placed on top of the heater, the ring temperature for the stationary heater is lower, therefore, less deposition occurs on the ring. The chamber is usually cleaned every 25 to 50 wafers. The reduction in deposition on the purge ring reduces cleaning frequency and time, therefore increases throughout.

In conclusion, provided herewith is a vacuum chamber for depositing a film on a substrate for semiconductor manufacturing, comprising a process compartment; a purge compartment; a purge ring located on the chamber body, which separates the process compartment from the purge compartment; a heater; and a shadow ring. The shadow ring covers the periphery of the substrate.

The chamber of the present invention may further comprise a shadow ring lift, which is interconnected with the shadow ring. The lift is driven by an actuator, which is a pneumatic motor or a step motor.

Alternatively, the chamber of the present invention may further comprise a movable shield and a shield lift instead of a shadow ring lift. The shield is interconnected with the shadow ring. The lift is driven by an actuator, which is a pneumatic motor or a step motor. The shield has a plurality of pumping holes for even pumping.

Furthermore, a substrate lift is located in the chamber and interconnected with the substrate. The lift is driven by an actuator, which is a step motor. Additionally, a shaft is also located in the chamber to support the stationary heater.

In one aspect, the substrate is a wafer. The film deposited can be metals or dielectrics, such as tungsten. This chamber uses bottom purge for purging the edge of the substrate, and the gas used for purging is a mixture of reactive gas and inert gas. A representative example of the reactive gas is hydrogen. The heater can be made of a representative thermal conductive materials such as aluminum, ceramic or aluminum nitride.

In another aspect of the present invention, there is provided a method for depositing a film of uniformity on a substrate in a chamber. This method comprises the following steps: (1) positioning the substrate on a substrate receiving surface of a substrate support member in a process compartment. The periphery of the substrate is covered by a shadow ring; (2) flowing a process gas into the process compartment and to the non-covered areas of the substrate; (3) flowing a purge gas through a purge gas channel positioned in a purge compartment. The purge compartment is separated from the process compartment by a purge ring, which is located on the chamber body; and (4) exhausting the process and purge gas from the chamber through a pumping channel formed in the chamber body. As a result, a uniform film is deposited on the substrate in the chamber.

In this method, the substrate support member is a heater and can be made of a thermal conductive material such as ceramic, aluminum or aluminum nitride. The process gas comprises tungsten, while the purge gas is a mixture of reactive gas and inert gas. An example of the reactive gas is hydrogen.

Furthermore, both the substrate and the shadow ring are moved vertically in the process compartment via a crankshaft drive, which is provided by an actuator. The actuator may be, for example, a step motor or a pneumatic motor.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A chamber for depositing a film on a substrate for semiconductor manufacturing, comprising:
    a process compartment;
    a stationary heater, said stationary heater supporting said substrate;
    a shadow ring, said shadow ring covering the periphery of said substrate;
    a purge compartment;
    a purge ring, said purge ring interconnected with said chamber by an annular support, said purge ring separating said process compartment from said purge compartment;
    wherein said purge compartment comprises a bottom section of said chamber, said purge compartment further comprising an edge purge, said edge purge providing a flow of a purge gas upwardly between said purge ring and said stationary heater to an edge of said substrate and perpendicular with the edge of said substrate.

2. The chamber of claim 1, further comprising:
    a shadow ring lift, wherein said shadow ring lift is interconnected with said shadow ring.

3. The chamber of claim 2, wherein said shadow ring lift is driven by an actuator.

4. The chamber of claim 3, wherein said actuator is a pneumatic motor or a step motor.

5. The chamber of claim 1, further comprising:
    a shaft, wherein said shaft is interconnected with said heater.

6. The chamber of claim 1, further comprising: a substrate lift, wherein said substrate lift is interconnected with the substrate.

7. The chamber of claim 6, wherein said substrate lift is driven by an actuator.

8. The chamber of claim 7, wherein said actuator is a step motor.

9. The chamber of claim 1, wherein said substrate is a wafer.

10. The chamber of claim 1, wherein said film is made of metals or dielectrics.

11. The chamber of claim 10, wherein said metal is tungsten.

12. The chamber of claim 1, wherein said purge gas is a mixture of reactive gas and inert gas.

13. The chamber of claim 12, wherein said reactive gas comprises hydrogen.

14. The chamber of claim 1, wherein said heater is made of a thermal conductive material selected from the group consisting of aluminum, ceramic and aluminum nitride.

15. A chamber for depositing a film on a substrate for semiconductor manufacturing, comprising:
    a process compartment;
    a stationary heater, said stationary heater supporting said substrate;
    a shadow ring, said shadow ring covering the periphery of said substrate;
    a shield, said shield interconnected with said shadow ring;
    a shield lift, said shield lift interconnected with said shield;
    a purge compartment; and
    a purge ring, said purge ring interconnected with said chamber by an annular support, said purge ring separating said process compartment from said purge compartment;
    wherein said purge compartment comprises a bottom section of said chamber, said purge compartment further comprising an edge purge, said edge purge providing a flow of a purge gas upwardly between said purge ring and said stationary heater to an edge of said substrate and perpendicular with the edge of said substrate.

16. The chamber of claim 15, wherein said shield has a plurality of pumping holes.

17. The chamber of claim 15, wherein said shield lift is driven by an actuator.

18. The chamber of claim 17, wherein said actuator is a pneumatic motor or a step motor.

19. The chamber of claim 15, further comprising:
- a shaft, wherein said shaft is interconnected with said heater.

20. The chamber of claim 15 further comprising:
- a substrate lift, wherein said substrate lift is interconnected with the substrate.

21. The chamber of claim 20, wherein said substrate lift is driven by an actuator.

22. The chamber of claim 21, wherein said actuator is a step motor.

23. The chamber of claim 15, wherein said heater is made of a thermal conductive material selected from the group consisting of aluminum, ceramic and aluminum nitride.

* * * * *